US006902771B2

(12) United States Patent
Shiota et al.

(10) Patent No.: US 6,902,771 B2
(45) Date of Patent: Jun. 7, 2005

(54) PROCESS FOR PRODUCING SILICA-BASED FILM, SILICA-BASED FILM, INSULATING FILM, AND SEMICONDUCTOR DEVICE

(75) Inventors: Atsushi Shiota, Ibaraki (JP); Kouji Sumiya, Ibaraki (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/770,289

(22) Filed: Jan. 29, 2001

(65) Prior Publication Data

US 2001/0018129 A1 Aug. 30, 2001

(30) Foreign Application Priority Data

Feb. 1, 2000 (JP) .................................. P. 2000-023559

(51) Int. Cl.$^7$ .............................. B01J 19/08; B32B 9/04
(52) U.S. Cl. ......................... 427/515; 427/96; 428/446
(58) Field of Search ................................ 427/510, 515, 427/516, 508, 96; 528/10, 33; 428/447

(56) References Cited

U.S. PATENT DOCUMENTS

| | | | | |
|---|---|---|---|---|
| 6,132,814 A | * | 10/2000 | Livesay et al. | 427/240 |
| 6,177,143 B1 | * | 1/2001 | Treadwell et al. | 427/508 |
| 6,204,201 B1 | | 3/2001 | Ross | |
| 6,207,555 B1 | | 3/2001 | Ross | |
| 6,271,146 B1 | | 8/2001 | Ross | |
| 6,319,655 B1 | | 11/2001 | Wong et al. | |
| 6,358,670 B1 | | 3/2002 | Wong et al. | |
| 6,395,607 B1 | * | 5/2002 | Chung | 438/312 |
| 6,426,127 B1 | | 7/2002 | Ross et al. | |
| 6,489,225 B1 | | 12/2002 | Ross et al. | |
| 6,548,899 B2 | | 4/2003 | Ross | |
| 6,582,777 B1 | | 6/2003 | Ross et al. | |
| 2003/0008481 A1 | | 1/2003 | Ross et al. | |
| 2003/0089992 A1 | * | 5/2003 | Rathi et al. | 257/762 |
| 2003/0102084 A1 | | 6/2003 | Livesay et al. | |

FOREIGN PATENT DOCUMENTS

| | | |
|---|---|---|
| EP | 0 921 561 | 6/1999 |
| EP | 1 050 601 | 11/2000 |
| JP | 9246232 | 9/1997 |
| JP | 2001015500 | 1/2001 |
| WO | WO 97/00535 | 1/1997 |
| WO | WO 99/36953 | 7/1999 |

OTHER PUBLICATIONS

McClatchie, S. et al. "Low Dielectric Constant Oxide Films Deposited Using CVD Techniques", Dumic Conference Proceedings, Feb. 1998, pp. 311–318.

J.J. Yang. et al., "Electron Beam Curing of Siloxane SOG for Non–etch Back Process", Advanced Metallization & Interconnect Systems for ULSI Applications in 1996: Materials Research Society Conference Proceedings. ed. Robert Havemann. et al., May 1997, pp. 505–509.

J.J. Yang, et al., "Integration of Spin–on Low–k Dielectrics Using E–Beam Curing for ULSI Multilevel Interconnects", Advanced Metallization and Interconnect Systems for ULSI Applications in 1997: Materials Research Society Conference Proceedings. ed. R. Cheung, et al., Mar. 1999, pp. 359–365.

U.S. Appl. No. 09/778,822, filed Feb. 8, 2001, Pending.
U.S. Appl. No. 09/670,547, filed Sep. 27, 2000, Pending.
U.S. Appl. No. 09/669,859, filed Sep. 27, 2000, Pending.
U.S. Appl. No. 09/770,289, filed Jan. 29, 2001, Pending.

* cited by examiner

*Primary Examiner*—Michael J. Feely
(74) *Attorney, Agent, or Firm*—Oblon, Spivak, McClelland, Maier & Neustadt, P.C.

(57) ABSTRACT

A process for producing a silica-based film which comprises irradiating a film comprising at least one siloxane compound with electron beams to thereby convert the film into a film having a dielectric constant of 3 or lower and having silicon carbide bonds represented by Si—C—Si is disclosed. The film has an even thickness, is excellent in storage stability, dielectric constant, mechanical strength, etc., has low hygroscopicity, and is suitable for use as a dielectric film in semiconductor devices and the like.

12 Claims, No Drawings

PROCESS FOR PRODUCING SILICA-BASED FILM, SILICA-BASED FILM, INSULATING FILM, AND SEMICONDUCTOR DEVICE

FIELD OF THE INVENTION

The present invention relates to a process for producing a film. More particularly, the invention relates to a process capable of giving a coating film which is excellent in dielectric constant, mechanical strength, and low hygroscopicity, and is suitable for use as a dielectric film in semiconductor devices and the like.

BACKGROUND OF THE INVENTION

Silica ($SiO_2$) films formed by vacuum processes such as the CVD method have hitherto been used frequently as dielectric films in semiconductor devices and other devices. In recent years, a dielectric film which comprises a tetraalkoxysilane hydrolyzate as the main component and is called an SOG (spin on glass) film has come to be used for the purpose of forming a more even dielectric film. Furthermore, as a result of the trend toward higher degree of integration in semiconductor devices and the like, a dielectric film called an organic SOG film has been developed which comprises a polyorganosiloxane as the main component and has a low dielectric constant.

However, with further progress in the high integration or multilayer film interconnection in semiconductor devices and the like, better electrical insulation between metal lines and vias has come to be required and, hence, a dielectric film has come to be desired which has satisfactory storage stability, a lower dielectric constant, and excellent leakage current characteristics.

JP-A-6-181201 (the term "JP-A" as used herein means an "unexamined published Japanese patent application") discloses a dielectric film having a lower dielectric constant. This technique is intended to provide an insulating film for semiconductor devices which has low water absorption and excellent cracking resistance. This insulating film is formed from a composition which comprises as the main component an oligomer having a number average molecular weight of 500 or higher obtained by condensation-polymerizing an organometallic compound containing at least one element selected from titanium, zirconium, niobium, and tantalum with an organosilicon compound having at least one alkoxyl group in the molecule.

JP-A-10-237307 and WO 97/00535 disclose techniques for curing an SOG film with electron beams, which comprise irradiating a resin comprising a siloxane resin as the main component with electron beams. These techniques are intended to convert a siloxane resin into silica ($SiO_2$) by electron beam irradiation. The insulating film thus obtained usually has a dielectric constant of from 3.5 to 4.2, which is still too high to apply the insulating film to semiconductor devices which operate at a high frequency.

SUMMARY OF THE INVENTION

Accordingly, one object of the invention is to provide a process for film production for eliminating the problem described above. More particularly, the object is to provide a process for producing an insulating film which has an excellent balance between dielectric constant and mechanical strength and is suitable for use as a dielectric film in semiconductor devices and the like.

Another object of the invention is to provide a process for producing a silica-based film which comprises irradiating a film comprising at least one siloxane compound with electron beams.

Still another object of the invention is to provide a film obtained by the process and an insulating film.

DETAILED DESCRIPTION OF THE INVENTION

In the invention, a film comprising at least one siloxane compound (hereinafter referred to as "coating film") is formed on a substrate.

For forming the coating film, a coating composition prepared by dissolving at least one siloxane compound in an organic solvent (hereinafter referred to as "coating composition") is applied to a substrate and the organic solvent is removed from the coating.

Ingredient (A) which is the siloxane compound in the invention is a product of the hydrolysis and/or condensation of at least one compound selected from the group consisting of compounds represented by the following formula (1) (hereinafter referred to as "compounds (1)"):

$$R^1{}_a Si(OR^2)_{4-a} \quad (1)$$

wherein $R^1$ represents a hydrogen atom or a monovalent organic group; $R^2$ represents a monovalent organic group; and a Is an integer of 0 to 2, and compounds represented by the following formula (2) (hereinafter referred to as "compounds (2)"):

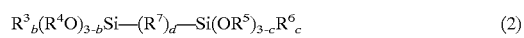
$$R^3{}_b(R^4O)_{3-b}Si\text{—}(R^7)_d\text{—}Si(OR^5)_{3-c}R^6{}_c \quad (2)$$

wherein $R^3$, $R^4$, $R^5$, and $R^6$ may be the same or different and each represents a monovalent organic group; b and c may be the same or different and each is an integer of 0 to 2; $R^7$ represents an oxygen atom or a group represented by —$(CH_2)_n$—, wherein n is 1 to 6; and d is 0 or 1.

Examples of the monovalent organic groups represented by $R^1$ and $R^2$ in formula (1) include alkyl, aryl, allyl, and glycidyl groups. In formula (1), $R^1$ is preferably a monovalent organic group, more preferably an alkyl or phenyl group.

The alkyl group preferably has 1 to 5 carbon atoms, and examples thereof include methyl, ethyl, propyl, and butyl. Those alkyl groups may be linear or branched, and may be ones in which one or more of the hydrogen atoms have been replaced, for example, with fluorine atoms.

In formula (1), examples of the aryl group include phenyl, naphthyl, methylphenyl, ethylphenyl, chlorophenyl, bromophenyl, and fluorophenyl.

Specific examples of the compounds represented by formula (1) include:
trialkoxysilanes such as trimethoxysilane, triethoxysilane, tri-n-propoxysilane, triisopropoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotriisopropoxysilane, fluorotri-n-butoxysilane, fluorotri-sec-butoxysilane, fluorotri-tert-butoxysilane, and fluorotriphenoxysilane;
tetraalkoxysilanes such as tetramethoxysilane, tetraethoxysilane, tetra-n-propoxysilane, tetraisopropoxysilane tetra-n-butoxysilane, tetra-sec-butoxysilane, tetra-tert-butoxysilane, and tetraphenoxysilane; alkyltrialkoxysilanes such as methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, ethyl trimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, and tert-butyltri-tert-butoxysilane;

tert-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, vinyltrimethoxysilane, vinyltriethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, and γ-trifluoropropyltriethoxysilane; and dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, divinyltrimethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, and γ-trifluoropropyltriethoxysilane.

Preferred of those compounds (1) are tetramethoxysilane, tetraethoxysilane, tetra-n-propoxysilane, tetraisopropoxysilane, tetraphenoxysilane, methyltrimethoxysilane, methyltriethoxysilane, methyltri-n-propoxysilane, methyltriisopropoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, diphenyldiethoxysilane, trimethylmonomethoxysilane, trimethylmonoethoxysilane, triethylmonomethoxysilane, triethylmonoethoxysilane, triphenylmonomethoxysilane, and triphenylmonoethoxysilane.

In formula (2), examples of the monovalent organic group include the same organic groups as those enumerated above with regard to formula (1).

Examples of the divalent organic group represented by $R^7$ in formula (2) include alkylene groups having 2 to 6 carbon atoms, such as methylene.

Examples of the compounds represented by formula (2) wherein $R^7$ is an oxygen atom include hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentamethoxy-3-phenyldisiloxane, 1,1,1,3,3-pentaethoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,1,3,3-tetraethoxy-1,3-diphenyldisiloxane, 1,1,3,-trimethoxy-1,3,3-trimethyldisiloxane, 1,1,3-triethoxy-1,3,3-trimethyldisiloxane, 1,1,3-trimethoxy-1,3,3-triphenyldisiloxane, 1,1,3-triethoxy-1,3,3-triphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, and 1,3-diethoxy-1,1,3,3-tetraphenyldisiloxane. Preferred of these are hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, 1,3-diethoxy-1,1,3,3-tetraphenyldisiloxane, and the like.

Examples of the compounds represented by formula (2) wherein d is 0 include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentamethoxy-2-phenyldisilane, 1,1,1,2,2-pentaethoxy-2-phenyldisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,1,2,2-tetraethoxy-1,2-diphenyldisilane, 1,1,2-trimethoxy-1,2,2-trimethyldisilane, 1,1,2-triethoxy-1,2,2-trimethyldisilane, 1,1,2-trimethoxy-1,2,2-triphenyldisilane, 1,1,2-triethoxy-1,2,2-triphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, and 1,2-diethoxy-1,1,2,2-tetraphenyldisilane.

Examples of the compounds represented by formula (2) wherein $R^7$ is a group represented by —$(CH_2)_n$— include bis(hexamethoxysilyl)methane, bis(hexaethoxysilyl)methane, bis(hexaphenoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane, bis(ethoxydiphenylsilyl)methane, bis(hexamethoxysilyl)ethane, bis(hexaethoxysilyl)ethane, bis(hexaphenoxysilyl)ethane, bis(dimethoxymethylsilyl) ethane, bis(diethoxymethylsilyl)ethane, bis(dimethoxyphenylsilyl)ethane, bis(diethoxyphenylsilyl)ethane, bis(methoxydimethylsilyl)ethane, bis(ethoxydimethylsilyl)ethane, bis(methoxydiphenylsilyl)ethane, bis(ethoxydiphenylsilyl)ethane, 1,3-bis(hexamethoxysilyl))propane, 1,3-bis(hexaethoxysilyl)propane, 1,3-bis(hexaphenoxysilyl)propane, 1,3-bis(dimethoxymethylsilyl)propane, 1,3-bis(diethoxymethylsilyl)propane, 1,3-bis(dimethoxyphenylsilyl)propane, 1,3-bis(diethoxyphenylsilyl)propane, 1,3-bis(methoxydimehylsilyl)propane, 1,3-bis(ethoxydimethylsilyl)propane, 1,3-bis(methoxydiphenylsilyl)propane, and 1,3-bis(ethoxydiphenylsilyl)propane. Preferred of these are hexamethoxydisilane, hexaethoxydisilane, hexaphenoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,1,2,2-tetraethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, bis(hexamethoxysilyl)methane, bis(hexaethoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane, and bis(ethoxydiphenylsilyl)methane.

In the invention, it is preferred to use a combination of an alkyltrialkoxysilane and a tetraalkoxysilane among the compounds (1) and (2) enumerated above. In this case, the proportion of the tetraalkoxysilane is generally from 5 to 75% by weight, preferably from 10 to 70% by weight, more preferably from 15 to 70% by weight, and that of the alkyltrialkoxysilane is generally from 25 to 95% by weight, preferably from 30 to 90% by weight, more preferably from 30 to 85% by weight, in terms of the amount of the product of complete hydrolysis and condensation. When a tetraalkoxysilane and a trialkoxysilane are used in a proportion within that range, the coating film obtained has a high modulus of elasticity and an exceedingly low dielectric constant.

The term "product of complete hydrolysis and condensation" as used herein means a product in which all the $R^2O$—, $R^4O$—, and $R^5O$— groups in the compounds (1) and (2) have been hydrolyzed into SiOH groups and completely condensed to form a siloxane structure.

The compounds (1) and (2) are hydrolyzed and condensed in an organic solvent. Water is preferably used in the hydrolysis and condensation in an amount of from 0.3 to 10 mol per mol of the groups represented by $R^2O$—, $R^4O$—, and $R^5O$— in formulae (1) and (2).

A catalyst is generally used for the hydrolysis and condensation of the compounds (1) and (2) in an organic solvent.

Examples of the catalyst include organic acids, inorganic acids, organic bases, inorganic bases, and metal chelates.

Examples of the organic acids include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acids, phthalic acid, fumaric acid, citric acid, and tartaric acid.

Examples of the inorganic acids include hydrochloric acid, nitric acid, sulfuric acid, hydrofluoric acid, and phosphoric acid.

Examples of the inorganic bases include ammonia, sodium hydroxide, potassium hydroxide, barium hydroxide, and calcium hydroxide.

Examples of the organic bases include methanolamine, ethanolamine, propanolamine, butanolamine, N-methylmethanolamine, N-ethylmethanolamine, N-propylmethanolamine, N-butylmethanolamine, N-methylethanolamine, N-ethylethanolamine, N-propylethanolamine, N-butylethanolamine, N-methylpropanolamine, N-ethylpropanolamine, N-propylpropanolamine, N-butylpropanolamine, N-methylbutanolamine, N-ethylbutanolamine, N-propylbutanolamine, N-butylbutanolamine, N,N-dimethylmethanolamine, N,N-diethylmethanolamine, N,N-dipropylmethanolamine, N,N-dibutylmethanolamine, N,N-dimethylethanolamine, N,N-diethylethanolamine, N,N-dipropylethanolamine, N,N-dibutylethanolamine, N,N-dimethylpropanolamine, N,N-diethylpropanolamine, N,N-dipropylpropanolamine, N,N-dibutylpropanolamine, N,N-dimethylbutanolamine, N,N-diethylbutanolamine, N,N-dipropylbutanolamine, N,N-dibutylbutanolamine, N-methyldimethanolamine, N-ethyldimethanolamine, N-propyldimethanolamine, N-butyldimethanolamine, N-methyldiethanolamine, N-ethyldiethanolamine, N-propyldiethanolamine, N-butyldiethanolamine, N-methyldipropanolamine, N-ethyldipropanolamine, N-propyldipropanolamine, N-butyldipropanolamine, N-methyldibutanolamine, N-ethyldibutanolamine, N-propyldibutanolamine, N-butyldibutanolamine, N-(aminomethyl)methanolamine, N-(aminomethyl)ethanolamine, N-(aminomethyl)propanolamine, N-(aminomethyl)butanolamine, N-(aminoethyl)methanolamine, N-(aminoethyl)ethanolamine, N-(aminoethyl)propanolamine, N-(aminoethyl)butanolamine, N-(aminopropyl)methanolamine, N-(aminopropyl)ethanolamine, N-(aminopropyl)propanolamine, N-(aminopropyl)butanolamine, N-(aminobutyl)methanolamine, N-(aminobutyl)ethanolamine, N-(aminobutyl)propanolamine, N-(aminobutyl)butanolamine, methoxymethylamine, methoxyethylamine, methoxypropylamine, methoxybutylamine, ethoxymethylamine, ethoxyethylamine, ethoxypropylamine, ethoxybutylamine, propoxymethylamine, propoxyethylamine, propoxypropylamine, propoxybutylamine, butoxymethylamine, butoxyethylamine, butoxypropylamine, butoxybutylamine, methylamine, ethylamine, propylamine, butylamine, N,N-dimethylamine, N,N-diethylamine, N,N-dipropylamine, N,N-dibutylamine, trimethylamine, triethylamine, tripropylamine, tributylamine, tetramethylammonium hydroxide, tetraethylammonium hydroxide, tetrapropylammonium hydroxide, tetrabutylammonium hydroxide, tetramethylethylenediamine, tetraethylethylenediamine, tetrapropylethylenediamine, tetrabutylethylenediamine, methylaminomethylamine, methylaminoethylamine, methylaminopropylamine, methylaminobutylamine, ethylaminomethylamine, ethylaminoethylamine, ethylaminopropylamine, ethylaminobutylamine, propylaminomethylamine, propylaminoethylamine, propylaminopropylamine, propylaminobutylamine, butylaminomethylamine, butylaminoethylamine, butylaminopropylamine, butylaminobutylamine, pyridine, pyrrole, piperazine, pyrrolidine, piperidine, picoline, morpholine, methylmorpholine, diazabicyclooctane, diazabicyclononane, diazabicycloundecene, and urea.

Examples of the metal chelates include titanium chelate compounds such as triethoxymono(acetylacetonato)titanium, tri-n-propoxymono(acetylacetonato)titanium, triisopropoxymono(acetylacetonato)titanium, tri-n-butoxymono(acetylacetonato)titanium, tri-sec-butoxymono(acetylacetonato)titanium, tri-tert-butoxymono(acetylacetonato)titanium, diethoxybis(acetylacetonato)titanium, di-n-propoxybis(acetylacetonato)titanium, diisopropoxybis(acetylacetonato)titanium, di-n-butoxybis(acetylacetonato)titanium, di-sec-butoxybis(acetylacetonato)titanium, di-tert-butoxybis(acetylacetonato)titanium, monoethoxytris(acetylacetonato)titanium, mono-n-propoxytris(acetylacetonato)titanium, monoisopropoxytris(acetylacetonato)titanium, mono-n-butoxytris(acetylacetonato)titanium, mono-sec-butoxytris(acetylacetonato)titanium, mono-tert-butoxytris(acetylacetonato)titanium, tetrakis(acetylacetonato)titanium, triethoxymono(ethylacetoacetato)titanium, tri-n-propoxymono(ethylacetoacetato)titanium, triisopropoxymono(ethylacetoacetato)titanium, tri-n-butoxymono(ethylacetoacetato)titanium, tri-sec-butoxymono(ethylacetoacetato)titanium, tri-tert-butoxymono(ethylacetoacetato)titanium, diethoxybis(ethylacetoacetato)titanium, di-n-propoxybis(ethylacetoacetato)titanium, disopropoxybis(ethylacetoacetato)titanium, di-n-butoxybis(ethylacetoacetato)titanium, di-sec-butoxybis(ethylacetoacetato)titanium, di-tert-butoxybis(ethylacetoacetato)titanium, monoethoxytris(ethylacetoacetato)titanium, mono-n-propoxytris(ethylacetoacetato)titanium, monoisopropoxytris(ethylacetoacetato)titanium, mono-n-butoxytris(ethylacetoacetato)titanium, mono-sec-butoxytris(ethylacetoacetato)titanium, mono-tert-butoxytris(ethylacetoacetato)titanium, tetrakis(ethylacetoacetato)titanium, mono(acetylacetonato)tris(ethylacetoacetato)titanium, bis(acetylacetonato)bis(ethylacetoacetato)titanium, and tris(acetylacetonato)mono(ethylacetoacetato) titanium; zirconium chelate compounds such as triethoxymono(acetylacetonato)zirconium, tri-n-propoxymono(acetylacetonato)zirconium, triisopropoxymono(acetylacetonato)zirconium, tri-n-butoxymono(acetylacetonato)zirconium, tri-sec-butoxymono(acetylacetonato)zirconium, tri-tert-butoxymono(acetylacetonato)zirconium, diethoxybis(acetylacetonato)zirconium, di-n-propoxybis(acetylacetonato)zirconium, disopropoxybis(acetylacetonato)zirconium, di-n-butoxybis(acetylacetonato)zirconium, di-sec-butoxybis(acetylacetonato)zirconium, di-tert-butoxybis(acetylacetonato)zirconium, monoethoxytris(acetylacetonato)zirconium, mono-n-propoxytris(acetylacetonato)zirconium, monoisopropoxytris(acetylacetonato) zirconium, mono-n-butoxytris(acetylacetonato)zirconium, mono-sec-butoxytris(acetylacetonato)zirconium, mono-tert-butoxytris(acetylacetonato)zirconium, tetrakis(acetylacetonato)zirconium, triethoxymono(ethylacetoacetato)zirconium, tri-n-propoxymono(ethylacetoacetato)zirconium, triisopropoxymono(ethylacetoacetato)zirconium, tri-n-butoxymono(ethylacetoacetato)zirconium, tri-sec-butoxymono(ethylacetoacetato)zirconium, tri-tert-butoxymono(ethylacetoacetato)zirconium, diethoxybis(ethylacetoacetato)zirconium, di-n-propoxybis(ethylacetoacetato)zirconium, diisopropoxybis(ethylacetoacetato)zirconium, di-n-butoxybis(ethylacetoacetato)zirconium, di-sec-butoxybis(ethylacetoacetato)zirconium, di-tert-butoxybis(ethylacetoacetato)zirconium, monoethoxytris(ethylacetoacetato)zirconium, mono-n-propoxytris(ethylacetoacetato)zirconium, monoisopropoxytris(ethylacetoacetato)zirconium, mono-n-butoxytris(ethylacetoacetato)zirconium, mono-sec-butoxytris(ethylacetoacetato)zirconium, mono-tert-butoxytris(ethylacetoacetato)zirconium, tetrakis(ethylacetoacetato)zirconium, mono(acetylacetonato)tris(ethylacetoacetato)zirconium, bis(acetylacetonato)bis(ethylacetoacetato)zirconium, and tris(acetylacetonato)mono(ethylacetoacetato)zirconium; and aluminum chelate compounds such as tris(acetylacetonato)aluminum and tris(ethylacetoacetato)aluminum.

The amount of the catalyst to be used is generally from 0.0001 to 1 mol, preferably from 0.001 to 0.1 mol, per mol of the total amount of the compounds (1) and (2).

In the case where the siloxane compound is a condensate, it preferably has a weight-average molecular weight, calculated for standard polystyrene, of from 500 to 100,000.

In the invention, the siloxane compound is usually dissolved in an organic solvent and applied as a coating composition.

Examples of the solvent which can be used in the invention include aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, diisopropylbenzene, n-amylnaphthalene, and trimethylbenzene; monohydric alcohols such as methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol diacetone alcohol, and cresol; polyhydric alcohols such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerol; ketone solvents such as acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclohexanone, methylcyclohexanone, 2,4-pentanedione, acetonylacetone, diacetone alcohol, acetophenone, and fenchone; ether solvents such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropyl glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propanesultone. These solvents can be used alone or as a mixture of two or more thereof.

It is especially preferred in the invention to use an organic solvent having a boiling point lower than 250° C. Examples thereof include alcohols such as methanol, ethanol, and isopropanol; polyhydric alcohols such as ethylene glycol and glycerol; glycol ether solvents such as ethylene glycol monomethyl ether, ethylene glycol monobutyl ether, diethyl glycol monoethyl ether, diethylene glycol diethyl ether, propylene glycol monopropyl ether, and dipropylene glycol monoethyl ether; glycol acetate/ether solvents such as ethylene glycol monomethyl ether acetate, diethylene glycol monobutyl ether acetate, ethylene glycol diacetate, and propylene glycol methyl ether acetate; amide solvents such as N,N-dimethylacetamide, N,N-dimethylformamide, and N-methyl-2-pyrrolidone; ketone solvents such as acetone, methyl ethyl ketone, methyl isobutyl ketone, acetylacetone, and methyl amyl ketone; and carboxylic ester solvents such as ethyl lactate, methoxymethyl propionate, and ethoxyethyl propionate. These solvents may be used alone or in combination of two or more thereof.

The amount of the organic solvent to be used in the invention is generally from 0.3 to 25 times (by weight) the amount of the siloxane compound (in terms of the product of complete hydrolysis and condensation).

The coating composition for use in the invention can be produced by mixing the siloxane compound with an organic solvent together with other ingredients according to need.

Other Additives

The coating composition for use in the invention may further contain ingredients such as a colloidal silica, colloidal alumina, and surfactant.

The colloidal silica is a dispersion comprising, for example, any of the aforementioned hydrophilic organic solvents and high-purity silicic acid anhydride dispersed therein. It has an average particle diameter of generally from 5 to 30 nm, preferably from 10 to 20 nm, and a solid concentration of generally about from 10 to 40% by weight. Examples of the colloidal silica include the methanol silica sol and isopropanol silica sol manufactured by Nissan Chemical Industries, Ltd., and Oscal, manufactured by Catalysts & Chemicals Industries Co., Ltd.

Examples of the colloidal alumina include Alumina Sol 520, 100, and 200, manufactured by Nissan Chemical Industries, Ltd., and Alumina Clear Sol and Alumina Sol 10 and 132, manufactured by Kawaken Fine Chemicals Co., Ltd.

Examples of the surfactant include nonionic surfactants, anionic surfactants, cationic surfactants, and amphoteric surfactants, and further include silicone surfactants, poly(alkylene oxide) surfactants, and poly(meth)acrylate surfactants.

The coating composition for use in the invention preferably has a total solid concentration of from 2 to 30% by weight. The total solid concentration thereof is suitably regulated according to purposes of the use thereof. When the coating composition has a total solid concentration of from 2 to 30% by weight, the composition not only gives a coating film having an appropriate thickness but has better storage stability.

In the coating composition for use in the invention, the content of alcohols having a boiling point of 100° C. or lower is preferably 20% by weight or lower, more preferably 5% by weight or lower. There are cases where alcohols having a boiling point of 100° C. or lower generate during the hydrolysis and condensation of the compounds (1) and (2). It is therefore preferred to remove such low-boiling alcohols by distillation or another means so as to result in a content thereof of 20% by weight or lower, preferably 5% by weight or lower.

Examples of the substrate to which the coating composition is applied in the invention include silicon wafers, $SiO_2$ wafers, and SiN wafers. Usable coating techniques include spin coating, dip coating, roll coating, and spraying.

The coating film obtained in the invention by applying the coating composition to a substrate and removing the organic solvent therefrom has a thickness of generally from 0.05 to 3 μm, preferably from 0.1 to 2.5 μm.

In the invention, the coating film thus formed or an organic silica-based film obtained by curing the coating film is irradiated with electron beams.

The irradiation with electron beams according to the invention is conducted at an energy of generally from 0.1 to 50 keV, preferably from 1 to 30 keV, in an irradiation dose of generally from 1 to 1,000 μC/cm$^2$, preferably from 10 to 500 μC/cm$^2$.

Use of an accelerating voltage of from 0.1 to 50 keV is advantageous in that electron beams can sufficiently penetrate into inner parts of the coating film without passing through the film and damaging the underlying semiconductor device.

Furthermore, when the electron beam irradiation is conducted in an irradiation dose of from 1 to 1,000 μC/cm$^2$, the siloxane compound can be reacted throughout the coating film while minimizing damage to the coating film.

The temperature of the substrate during the electron beam irradiation is generally from 25 to 500° C., preferably from 25 to 450° C.

The time required for the coating film to cure with electron beams is generally about from 1 to 5 minutes, which is far shorter than the time of from 15 minutes to 2 hours required for thermal cure. It can therefore be said that electron beam irradiation is suitable for the treatment of individual wafers.

Before being irradiated with electron beams according to the invention, the coating film may be converted to an organic silica film having a dielectric constant of 3.0 or lower, preferably 2.9 or lower, more preferably 2.8 or lower, by heating the substrate at from 250 to 500° C. and thereby heat-curing the siloxane ingredient according to the invention.

The method in which the coating film is heat-cured and then irradiated with electron beams is effective in reducing the unevenness of film thickness attributable to unevenness of electron beam irradiation dose.

The electron beam irradiation in the invention is preferably conducted in an atmosphere having an oxygen concentration of 10,000 ppm or lower, preferably 1,000 ppm or lower.

It is possible to conduct the electron beam irradiation according to the invention in an inert gas atmosphere. Examples of the inert gas include nitrogen, helium, argon, krypton, and xenon. Preferred of these are helium, argon and nitrogen. When the electron beam irradiation is conducted in an inert gas atmosphere, the film being irradiated is less apt to be oxidized, so that a silica-based film retaining a low dielectric constant can be obtained.

The electron beam irradiation may be conducted in an atmosphere having a reduced pressure. The degree of vacuum is generally 133 Pa or lower, preferably from 0.133 to 26.7 Pa.

The silica-based film obtained by the invention has a carbon content (number of carbon atoms) of generally from 5 to 17% by mole, preferably from 9 to 15.5% by mole.

When the silica-based film obtained has a carbon content within that range, it can have improved mechanical strength while retaining a low dielectric constant.

A feature of this silica-based film resides in that it has silicon carbide bonds (Si—C—Si) within the film structure. In an infrared absorption spectrum, the silicon carbide bonds give a characteristic absorption around 890 cm$^{-1}$.

Because of such features, the silica-based film is excellent in insulating properties, evenness, dielectric constant characteristics, cracking resistance, and hardness.

Consequently, the silica-based film is useful in applications such as dielectric films for semiconductor devices such as LSIs, system LSIs, DRAMs, SDRAMs, RDRAMs, and D-RDRAMs, protective films such as surface coat films for semiconductor devices, dielectric films for multilayered printed circuit boards, and protective or insulating films for liquid-crystal display devices.

The invention will be explained below in more detail by reference to the following Examples.

In the following Examples and Production Example, all "parts" and "percents" are by weight unless otherwise indicated.

PRODUCTION EXAMPLE 1

An aqueous solution prepared by dissolving 1.0 g of maleic acid in 157.7 g of water was added dropwise over 1 hour at room temperature to a solution prepared by mixing 101.3 g of tetramethoxysilane (40.0 g in terms of the product of complete hydrolysis and condensation), 203.0 g of methyltrimethoxysilane (100.0 g in terms of the product of complete hydrolysis and condensation), 97.3 g of dimethyldimethoxysilane (60.0 g in terms of the product of complete hydrolysis and condensation), 559.3 g of propylene glycol monopropyl ether, and 239.7 g of methyl n-pentyl ketone. After completion of the addition, the resultant mixture was reacted at 60° C. for 2 hours and then concentrated under reduced pressure until the total solution amount reached 1,000 g. Thus, an ingredient (A) solution having a solid content of 20% was obtained.

PRODUCTION EXAMPLE 2

An aqueous solution prepared by dissolving 1.2 g of maleic acid in 157.7 g of water was added dropwise over 1 hour at room temperature to a solution prepared by mixing 152.0 g of tetramethoxysilane (60.0 g in terms of the product of complete hydrolysis and condensation), 284.1 g of methyltrimethoxysilane (140.0 g in terms of the product of complete hydrolysis and condensation), and 798.8 g of propylene glycol monomethyl ether. After completion of the addition, the resultant mixture was reacted at 60° C. for 2 hours and then concentrated under reduced pressure until the total solution amount reached 1,000 g. Thus, an ingredient (A) solution having a solid content of 20% was obtained.

PRODUCTION EXAMPLE 3

To a solution prepared by mixing 5 g of 25% aqueous ammonia solution, 320 g of ultrapure water, and 600 g of ethanol were added 15 g of methyltrimethoxysilane (7.4 g in terms of the product of complete hydrolysis and condensation) and 20 g of tetraethoxysilane (5.8 g in terms of the product of complete hydrolysis and condensation). After this mixture was reacted at 60° C. for 3 hours, 200 g of propylene glycol monopropyl ether was added thereto. The resultant mixture was concentrated under reduced pressure until the total solution amount reached 140 g. Thereafter, 10 g of a 10% acetic acid solution in propylene glycol monopropyl ether was added thereto. Thus, a composition solution having a solid content of 8.3% was obtained.

PRODUCTION EXAMPLE 4

In 290 g of propylene glycol monopropyl ether were dissolved 77.04 g of methyltrimethoxysilane, 24.05 g of tetramethoxysilane, and 0.48 g of tetrakis(acetylacetonato) titanium in a separable flask made of quartz. This solution was stirred with Three-One Motor and the temperature of the solution was kept at 60° C. Thereto was added 84 g of ion-exchanged water over 1 hour. The resultant mixture was reacted at 60° C. for 2 hours and 25 g of acetylacetone was then added. This reaction mixture was further reacted for 30 minutes and then cooled to room temperature. From the reaction mixture was removed 149 g of a solution comprising methanol and water by evaporation at 50° C. Thus, a reaction mixture was obtained.

The product of condensation and other reaction thus obtained had a weight-average molecular weight of 8,900.

PRODUCTION EXAMPLE 5

To a solution prepared by mixing 6 g of 40% aqueous methylamine solution, 228 g of ultrapure water, and 570 g of ethanol were added 13.6 g of methyltrimethoxysilane (6.7 g in terms of the product of complete hydrolysis and condensation) and 20.9 g of tetraethoxysilane (6 g in terms of the product of complete hydrolysis and condensation). After this mixture was reacted at 60° C. for 2 hours, 200 g of propylene glycol monopropyl ether was added thereto. The resulting mixture was concentrated under reduced pressure until the total solution amount reached 116 g. Thereafter, 10 g of a 10% acetic acid solution in propylene glycol monopropyl ether was added thereto. Thus, a coating composition 5 having a solid content of 10% was obtained.

EXAMPLE 1

The coating composition 1 obtained in Production Example 1 was applied to an 8-inch silicon wafer by spin coating to obtain a coating film having a thickness of 0.7 μm. This coating film was heated first at 80° C. in the air for 5 minutes and subsequently at 200° C. in nitrogen for 5 minutes and then irradiated with electron beams under the conditions shown in Table 1.

The film obtained was evaluated by the following methods. The results obtained are shown in Table 2.

1. Dielectric Constant

A sample for dielectric constant measurement was produced by forming an aluminum electrode pattern by vapor deposition on the film obtained. This sample was examined at a frequency of 100 kHz with precision LCR meter HP4284A, manufactured by Yokogawa-Hewlett-Packard, Ltd., by the CV method to determine the dielectric constant of the coating film.

2. Hardness

A Barkobitch type indenter was attached to a nanohardness meter (trade name: Nanoindentator XP) manufactured by MTS, and this hardness meter was used to determine the universal hardness of the organic silica-based film formed on the silicon wafer. Hardness was measured by Mechanical Properties Microprobe method.

3. Carbon Content

The number of carbon atoms was determined by the Rutherford backward scattering method and hydrogen forward coil scattering method. The carbon content is shown in terms of the proportion of carbon atoms to all atoms (% by mole).

4. Examination for Silicon Carbide Bond

Whether or not silicon carbide bonds were present was judged by infrared spectroscopy based on the absorption around 890 $cm^{-1}$ attributable to the stretching vibration of Si—C—Si.

5. Cracking Resistance

The composition sample was applied to an 8-inch silicon wafer by spin coating in such an amount as to result in a cured coating film having a thickness of 1.6 μm. This coating film was dried first at 90° C. on a hot plate for 3 minutes and then at 200° C. in a nitrogen atmosphere for 3 minutes. Subsequently, the coated substrate was burned for 60 minutes in a 420° C. vacuum oven evacuated to 6.65 Pa. The coating film obtained was partly incised with a knife and then immersed in pure water for 5 hours. Thereafter, the incision of the coating film was examined with a microscope to evaluate cracking resistance based on the following criteria.

○: No crack propagation was observed.

X: Crack propagation was observed.

EXAMPLES 2 TO 7

The coating compositions shown in Table 1 were used in the same manner as in Example 1 to obtain coating films respectively having the thicknesses shown in Table 1. The coating films obtained were heated first at 80° C. in the air for 5 minutes and subsequently at 200° C. in nitrogen for 5 minutes and then irradiated with electron beams under the conditions shown in Table 1.

The films obtained were evaluated in the same manner as in Example 1. The results obtained are shown in Table 2.

Reference Example 1

The coating composition 1 obtained in Production Example 1 was applied to an 8-inch silicon wafer by spin coating to obtain a coating film having a thickness of 0.8 μm. This coating film was heated first at 80° C. in the air for 5 minutes and then at 200° C. in nitrogen for 5 minutes. Subsequently, the coated wafer was inserted into an electron beam irradiator and heated therein at 400° C. for 5 minutes without conducting electron beam irradiation.

The film obtained was evaluated in the same manner as in Example 1. The results obtained are shown in Table 2.

The time required for electron beam irradiation in each of Examples 1 to 7 was within 7 minutes.

TABLE 1

| | | | Conditions for electron beam irradiation | | | | |
| --- | --- | --- | --- | --- | --- | --- | --- |
| Example | Coating composition | Film thickness (μm) | Accelerating voltage (keV) | Irradiation dose (μC/cm$^2$) | Ambient temperature (° C.) | Ambient pressure (Pa) | Ambient gas |
| Example 1 | 1 | 0.7 | 5 | 10 | 400 | 1.33 | Ar |
| Example 2 | 3 | 0.7 | 7 | 50 | 400 | 1.33 | N$_2$ |

TABLE 1-continued

| Example | Coating composition | Film thickness (μm) | Conditions for electron beam irradiation | | | | |
|---|---|---|---|---|---|---|---|
| | | | Accelerating voltage (keV) | Irradiation dose (μC/cm²) | Ambient temperature (° C.) | Ambient pressure (Pa) | Ambient gas |
| Example 3 | 2 | 1.8 | 15 | 75 | 350 | 1.33 | He |
| Example 4 | 2 | 1.2 | 5 | 100 | 400 | 13.3 | Ar |
| Example 5 | 1 | 1.2 | 3 | 200 | 350 | 1.33 | Ar |
| Example 6 | 3 | 0.1 | 1 | 75 | 400 | 93100 | Ar |
| Example 7 | 4 | 0.4 | 6 | 50 | 400 | 1.33 | Ar |
| Reference Example 1 | 1 | 0.7 | No electron beam irradiation | | 400 | 6.65 | $N_2$ |

TABLE 2

| | Dielectric constant | Hardness (GPa) | Carbon content (mol %) | Silicon carbide |
|---|---|---|---|---|
| Example 1 | 2.65 | 0.7 | 15.3 | Present |
| Example 2 | 2.18 | 0.7 | 11.0 | Present |
| Example 3 | 2.75 | 0.9 | 12.5 | Present |
| Example 4 | 2.78 | 1.4 | 12.4 | Present |
| Example 5 | 2.75 | 1.1 | 14.9 | Present |
| Example 6 | 2.22 | 0.7 | 11.5 | Present |
| Example 7 | 2.55 | 1.1 | 15.0 | Present |
| Reference Example 1 | 3.11 | 0.3 | 10.8 | Absent |

EXAMPLES 8 to 14

Each of the coating compositions shown in Table 3 was applied to an 8-inch silicon wafer by spin coating to obtain a coating film having a thickness of 0.8 μm. This coating film was heated first at 80° C. in the air for 5 minutes and subsequently at 200° C. in nitrogen for 5 minutes and then cured by heating at 400° C. for 30 minutes to form on the substrate an organic silica film having a dielectric constant of 2.8 or lower.

These organic silica films were irradiated with electron beams under the conditions shown in Table 3. The time required for electron beam irradiation in each of Examples 8 to 14 was within 7 minutes.

The films obtained were evaluated in the same manner as in Example 1. The results obtained are shown in Table 4.

TABLE 3

| Example | Coating composition | Film thickness (μm) | Carbon content (mol %) | Conditions for electron beam irradiation | | | | |
|---|---|---|---|---|---|---|---|---|
| | | | | Accelerating voltage (keV) | Irradiation dose (μC/cm²) | Ambient temperature (° C.) | Ambient pressure (Pa) | Ambient gas |
| Example 8 | 4 | 1.2 | 13.5 | 5 | 10 | 400 | 1.33 | Ar |
| Example 9 | 5 | 0.7 | 10.5 | 7 | 50 | 400 | 1.33 | $N_2$ |
| Example 10 | 2 | 1.8 | 12.5 | 15 | 75 | 350 | 1.33 | He |
| Example 11 | 2 | 1.2 | 12.5 | 5 | 100 | 400 | 13.3 | Ar |
| Example 12 | 4 | 1.6 | 13.5 | 3 | 200 | 350 | 1.33 | Ar |
| Example 13 | 5 | 0.1 | 10.5 | 1 | 75 | 400 | 93100 | Ar |
| Example 14 | 4 | 1.2 | 13.5 | 5 | 100 | 250 | 1.33 | Ar |

TABLE 4

| | Before electron beam irradiation | | | After electron beam irradiation | | | |
|---|---|---|---|---|---|---|---|
| Example | k | Hardness (GPa) | Si—C—Si bond | Cracking resistance | k | Hardness (GPa) | Si—C—Si bond | Cracking resistance |
| Example 8 | 2.6 | 0.71 | Absent | X | 2.6 | 0.9 | Present | ○ |
| Example 9 | 2.3 | 0.50 | Absent | ○ | 2.3 | 0.9 | Present | ○ |
| Example 10 | 2.2 | 0.25 | Absent | X | 2.2 | 0.6 | Present | ○ |
| Example 11 | 2.2 | 0.25 | Absent | ○ | 2.2 | 0.8 | Present | ○ |
| Example 12 | 2.6 | 0.71 | Absent | X | 2.7 | 1.1 | Present | ○ |
| Example 13 | 2.3 | 0.50 | Absent | ○ | 2.3 | 0.8 | Present | ○ |
| Example 14 | 2.6 | 0.71 | Absent | X | 2.6 | 1.0 | Present | ○ |

According to the invention, a film having a low dielectric constant and excellent mechanical strength can be provided.

What is claimed is:

1. A process for producing a silica-based dielectric film in a semiconductor device, the process comprising
    applying directly on a semiconductor device a film comprising at least one siloxane compound; and
    irradiating the film comprising at least one siloxane compound with electron beams at an irradiation dose of from 1 to 200 $\mu C/cm^2$ to thereby react the siloxane compound throughout the film and generate silicon carbide bonds represented by Si—C—Si while maintaining the dielectric constant of the film at a value of 3 or lower, wherein
    the siloxane compound is a product obtained from at least one compound selected from the group consisting of compounds represented by the following formula (1):

$$R^1_a Si(OR^2)_{4-a} \quad (1)$$

where $R^1$ represents a monovalent organic group or a hydrogen atom; $R^2$ represents a monovalent organic group; and a is an integer of 0 to 2, and
    compounds represented by the following formula (2):

$$R^3_b(R^4O)_{3-b}Si-(R^7)_d-Si(OR^5)_{3-c}R^6_c \quad (2)$$

where $R^3$, $R^4$, $R^5$, and $R^6$ may be the same or different and each represents a monovalent organic group; b and c may be the same or different and each is an integer of 0 to 2; $R^7$ represents an oxygen atom or a group represented by —$(CH_2)_n$—, where n is 1 to 6; and d is 0 or 1.

2. The process as claimed in claim 1, wherein the silica-based film has a dielectric constant of 2.8 or lower.

3. The process as claimed in claim 1, wherein
    the siloxane compound is a product of the hydrolysis and/or condensation of at least one compound selected from the group consisting of
    compounds represented by the following formula (1):

$$R^1_a Si(OR^2)_{4-a} \quad (1)$$

where $R^1$ represents a monovalent organic group or a hydrogen atom; $R^2$ represents a monovalent organic group; and a is an integer of 0 to 2, and
    compounds represented by the following formula (2):

$$R^3_b(R^4O)_{3-b}Si-(R^7)_d-Si(OR^5)_{3-c}R^6_c \quad (2)$$

where $R^3$, $R^4$, $R^5$, and $R^6$ may be the same or different and each represents a monovalent organic group; b and c may be the same or different and each is an integer of 0 to 2; $R^7$ represents an oxygen atom or a group represented by —$(CH_2)_n$—, where n is 1 to 6; and d is 0 or 1.

4. The process as claimed in claim 1, wherein the film comprising at least one siloxane compound has a thickness of from 0.05 to 3 $\mu m$.

5. The process as claimed in claim 1, wherein the electron beam irradiation is conducted at an energy of from 0.1 to 50 keV.

6. The process as claimed in claim 1, wherein the electron beam irradiation is conducted at 25 to 500° C.

7. The process as claimed in claim 1, wherein the electron beam irradiation is conducted in an atmosphere having an oxygen concentration of 10,000 ppm or lower.

8. The process as claimed in claim 1, wherein the electron beam irradiation is conducted in an inert gas atmosphere.

9. The process as claimed in claim 1, wherein the electron beam irradiation is conducted at 133.3 Pa or lower.

10. The process as claimed in claim 1, wherein the film comprising at least one siloxane compound is heat-cured at 300 to 500° C. before being subjected to the electron beam irradiation.

11. The process as claimed in claim 1, wherein the electron beam irradiation is conducted in an atmosphere having an oxygen concentration of 1,000 ppm or lower.

12. The process as claimed in claim 1, wherein the semiconductor device comprises at least one member of the group consisting of silicon, $SiO_2$ and SiN.

* * * * *